(12) United States Patent
Liao et al.

(10) Patent No.: US 8,481,391 B2
(45) Date of Patent: Jul. 9, 2013

(54) PROCESS FOR MANUFACTURING STRESS-PROVIDING STRUCTURE AND SEMICONDUCTOR DEVICE WITH SUCH STRESS-PROVIDING STRUCTURE

(75) Inventors: Chin-I Liao, Tainan (TW); Ching-Hong Jiang, Taipei County (TW); Ching-I Li, Tainan County (TW); Shu-Yen Chan, Changhua County (TW); Chin-Cheng Chien, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 132 days.

(21) Appl. No.: 13/110,294

(22) Filed: May 18, 2011

(65) Prior Publication Data

US 2012/0292638 A1 Nov. 22, 2012

(51) Int. Cl.
*H01L 21/336* (2006.01)
(52) U.S. Cl.
USPC ........... 438/285; 438/197; 438/303; 438/199; 257/77; 257/E21.409; 257/E29.242
(58) Field of Classification Search
USPC ............... 438/285, 197, 303, 199; 257/77, 257/E21.409, E29.242
See application file for complete search history.

(56) References Cited

U.S. PATENT DOCUMENTS

| | | | |
|---|---|---|---|
| 4,891,303 A | 1/1990 | Garza et al. | |
| 5,217,910 A | 6/1993 | Shimizu et al. | |
| 5,273,930 A | 12/1993 | Steele et al. | |
| 5,356,830 A | 10/1994 | Yoshikawa et al. | |
| 5,372,957 A | 12/1994 | Liang et al. | |
| 5,385,630 A | 1/1995 | Philipossian et al. | |
| 5,399,506 A | 3/1995 | Tsukamoto | |
| 5,625,217 A | 4/1997 | Chau et al. | |
| 5,777,364 A | 7/1998 | Crabbe et al. | |
| 5,783,478 A | 7/1998 | Chau et al. | |
| 5,783,479 A | 7/1998 | Lin et al. | |
| 5,793,090 A | 8/1998 | Gardner et al. | |
| 5,960,322 A | 9/1999 | Xiang et al. | |
| 6,030,874 A | 2/2000 | Grider et al. | |
| 6,048,756 A | 4/2000 | Lee et al. | |
| 6,074,954 A | 6/2000 | Lill et al. | |

(Continued)

OTHER PUBLICATIONS

Z. Luo, Y. F. Chong, J. Kim, N. Rovedo, B. Greene, S. Panda, T. Sato, J. Holt, D. Chidambarrao, J. Li, R. Davis, A. Madan, A. Turansky, O. Gluschenkov, R. Lindsay, A. Ajmera, J. Lee, S. Mishra, R. Amos, D. Schepis, H. Ng, K. Rim, Design of High Performance PFETs with Strained Si Channel and Laser Anneal, 2005 IEEE, NY, United States.

*Primary Examiner* — Thinh T Nguyen
(74) *Attorney, Agent, or Firm* — WPAT, PC; Justin King

(57) ABSTRACT

A process for manufacturing a stress-providing structure is applied to the fabrication of a semiconductor device. Firstly, a substrate with a channel structure is provided. A silicon nitride layer is formed over the substrate by chemical vapor deposition in a halogen-containing environment. An etching process is performed to partially remove the silicon nitride layer to expose a portion of a surface of the substrate beside the channel structure. The exposed surface of the substrate is etched to form a recess in the substrate. Then, the substrate is thermally treated at a temperature between 750° C. and 820° C. After the substrate is thermally treated, a stress-providing material is filled in the recess to form a stress-providing structure within the recess. The semiconductor device includes a substrate, a recess and a stress-providing structure. The recess has a round inner surface. The stress-providing structure has a round outer surface.

11 Claims, 3 Drawing Sheets

U.S. PATENT DOCUMENTS

| | | |
|---|---|---|
| 6,100,171 A | 8/2000 | Ishida |
| 6,110,787 A | 8/2000 | Chan et al. |
| 6,165,826 A | 12/2000 | Chau et al. |
| 6,165,881 A | 12/2000 | Tao et al. |
| 6,191,052 B1 | 2/2001 | Wang |
| 6,228,730 B1 | 5/2001 | Chen et al. |
| 6,274,447 B1 | 8/2001 | Takasou |
| 6,355,533 B2 | 3/2002 | Lee |
| 6,365,476 B1 | 4/2002 | Talwar et al. |
| 6,368,926 B1 | 4/2002 | Wu |
| 6,444,591 B1 | 9/2002 | Schuegraf et al. |
| 6,537,370 B1 | 3/2003 | Hernandez et al. |
| 6,544,822 B2 | 4/2003 | Kim et al. |
| 6,605,498 B1 | 8/2003 | Murthy et al. |
| 6,613,695 B2 | 9/2003 | Pomarede et al. |
| 6,621,131 B2 | 9/2003 | Murthy et al. |
| 6,624,068 B2 | 9/2003 | Thakar et al. |
| 6,632,718 B1 | 10/2003 | Grider et al. |
| 6,642,122 B1 | 11/2003 | Yu |
| 6,664,156 B1 | 12/2003 | Ang et al. |
| 6,676,764 B2 | 1/2004 | Joo |
| 6,699,763 B2 | 3/2004 | Grider et al. |
| 6,703,271 B2 | 3/2004 | Yeo et al. |
| 6,777,275 B1 | 8/2004 | Kluth |
| 6,806,151 B2 | 10/2004 | Wasshuber et al. |
| 6,809,402 B1 | 10/2004 | Hopper et al. |
| 6,858,506 B2 | 2/2005 | Chang |
| 6,861,318 B2 | 3/2005 | Murthy et al. |
| 6,864,135 B2 | 3/2005 | Grudowski et al. |
| 6,869,867 B2 | 3/2005 | Miyashita et al. |
| 6,885,084 B2 | 4/2005 | Murthy et al. |
| 6,887,751 B2 | 5/2005 | Chidambarrao et al. |
| 6,887,762 B1 | 5/2005 | Murthy et al. |
| 6,891,192 B2 | 5/2005 | Chen et al. |
| 6,930,007 B2 | 8/2005 | Bu et al. |
| 6,946,350 B2 | 9/2005 | Lindert et al. |
| 6,962,856 B2 | 11/2005 | Park et al. |
| 6,972,461 B1 | 12/2005 | Chen et al. |
| 6,991,979 B2 | 1/2006 | Ajmera et al. |
| 6,991,991 B2 | 1/2006 | Cheng et al. |
| 7,037,773 B2 | 5/2006 | Wang et al. |
| 7,060,576 B2 | 6/2006 | Lindert et al. |
| 7,060,579 B2 | 6/2006 | Chidambaram et al. |
| 7,112,495 B2 | 9/2006 | Ko et al. |
| 7,118,952 B2 | 10/2006 | Chen et al. |
| 7,132,338 B2 | 11/2006 | Samoilov et al. |
| 7,169,675 B2 | 1/2007 | Tan et al. |
| 7,183,596 B2 | 2/2007 | Wu et al. |
| 7,202,124 B2 | 4/2007 | Fitzgerald et al. |
| 7,217,627 B2 | 5/2007 | Kim |
| 7,288,822 B1 | 10/2007 | Ting et al. |
| 7,303,999 B1 | 12/2007 | Sriraman et al. |
| 7,335,959 B2 | 2/2008 | Curello et al. |
| 7,410,859 B1 | 8/2008 | Peidous et al. |
| 7,462,239 B2 | 12/2008 | Brabant et al. |
| 7,491,615 B2 | 2/2009 | Wu et al. |
| 7,494,856 B2 | 2/2009 | Zhang et al. |
| 7,494,858 B2 | 2/2009 | Bohr et al. |
| 7,560,758 B2 | 7/2009 | Zhu et al. |
| 7,592,231 B2 | 9/2009 | Cheng et al. |
| 7,667,227 B2 | 2/2010 | Shimamune et al. |
| 7,691,752 B2 | 4/2010 | Ranade et al. |
| 7,838,370 B2 | 11/2010 | Mehta et al. |
| 2002/0160587 A1 | 10/2002 | Jagannathan et al. |
| 2002/0182423 A1 | 12/2002 | Chu et al. |
| 2003/0181005 A1 | 9/2003 | Hachimine et al. |
| 2003/0203599 A1 | 10/2003 | Kanzawa et al. |
| 2004/0045499 A1 | 3/2004 | Langdo et al. |
| 2004/0067631 A1 | 4/2004 | Bu et al. |
| 2004/0227164 A1 | 11/2004 | Lee et al. |
| 2005/0062104 A1 * | 3/2005 | Kim et al. ................ 257/339 |
| 2005/0070076 A1 | 3/2005 | Dion |
| 2005/0079692 A1 | 4/2005 | Samoilov et al. |
| 2005/0082616 A1 | 4/2005 | Chen et al. |
| 2005/0139231 A1 | 6/2005 | Abadie et al. |
| 2005/0260830 A1 | 11/2005 | Kwon et al. |
| 2005/0285193 A1 | 12/2005 | Lee et al. |
| 2005/0287752 A1 | 12/2005 | Nouri et al. |
| 2006/0051922 A1 | 3/2006 | Huang et al. |
| 2006/0057859 A1 | 3/2006 | Chen |
| 2006/0076627 A1 | 4/2006 | Chen et al. |
| 2006/0088968 A1 | 4/2006 | Shin et al. |
| 2006/0115949 A1 | 6/2006 | Zhang et al. |
| 2006/0134872 A1 | 6/2006 | Hattendorf et al. |
| 2006/0163558 A1 | 7/2006 | Lee et al. |
| 2006/0228842 A1 | 10/2006 | Zhang et al. |
| 2006/0231826 A1 | 10/2006 | Kohyama |
| 2006/0258126 A1 | 11/2006 | Shiono et al. |
| 2006/0281288 A1 | 12/2006 | Kawamura et al. |
| 2006/0292779 A1 | 12/2006 | Chen et al. |
| 2006/0292783 A1 | 12/2006 | Lee et al. |
| 2007/0023847 A1 | 2/2007 | Rhee et al. |
| 2007/0034906 A1 | 2/2007 | Wang et al. |
| 2007/0049014 A1 | 3/2007 | Chen et al. |
| 2007/0072353 A1 | 3/2007 | Wu et al. |
| 2007/0072376 A1 | 3/2007 | Chen et al. |
| 2007/0082451 A1 | 4/2007 | Samoilov et al. |
| 2007/0128783 A1 | 6/2007 | Ting et al. |
| 2007/0128786 A1 | 6/2007 | Cheng et al. |
| 2007/0166929 A1 | 7/2007 | Matsumoto et al. |
| 2007/0262396 A1 | 11/2007 | Zhu et al. |
| 2008/0014688 A1 | 1/2008 | Thean et al. |
| 2008/0061366 A1 | 3/2008 | Liu et al. |
| 2008/0067545 A1 | 3/2008 | Rhee et al. |
| 2008/0076236 A1 | 3/2008 | Chiang et al. |
| 2008/0085577 A1 | 4/2008 | Shih et al. |
| 2008/0116525 A1 | 5/2008 | Liu et al. |
| 2008/0124874 A1 | 5/2008 | Park et al. |
| 2008/0128746 A1 | 6/2008 | Wang |
| 2008/0142886 A1 | 6/2008 | Liao et al. |
| 2008/0220579 A1 | 9/2008 | Pal et al. |
| 2008/0233722 A1 | 9/2008 | Liao et al. |
| 2008/0233746 A1 | 9/2008 | Huang et al. |
| 2009/0039389 A1 | 2/2009 | Tseng et al. |
| 2009/0045456 A1 | 2/2009 | Chen et al. |
| 2009/0095992 A1 | 4/2009 | Samuki et al. |
| 2009/0108291 A1 | 4/2009 | Cheng et al. |
| 2009/0117715 A1 | 5/2009 | Fukuda et al. |
| 2009/0124056 A1 | 5/2009 | Chen et al. |
| 2009/0166625 A1 | 7/2009 | Ting et al. |
| 2009/0184402 A1 | 7/2009 | Chen |
| 2009/0186475 A1 | 7/2009 | Ting et al. |
| 2009/0246922 A1 | 10/2009 | Wu et al. |
| 2009/0256160 A1 | 10/2009 | Liu et al. |
| 2009/0278170 A1 | 11/2009 | Yang et al. |
| 2009/0302348 A1 | 12/2009 | Adam et al. |
| 2010/0001317 A1 | 1/2010 | Chen et al. |
| 2010/0093147 A1 | 4/2010 | Liao et al. |

* cited by examiner

PROCESS FOR MANUFACTURING STRESS-PROVIDING STRUCTURE AND SEMICONDUCTOR DEVICE WITH SUCH STRESS-PROVIDING STRUCTURE

FIELD OF THE INVENTION

The present invention relates to a process for manufacturing a stress-providing structure, and more particularly to a process for manufacturing a stress-providing structure in fabrication of a semiconductor device. The present invention also relates to a semiconductor device with such a stress-providing structure.

BACKGROUND OF THE INVENTION

Generally, in the fabrication of a complementary metal-oxide-semiconductor (CMOS) transistor, a selective area epitaxial (SAE) process is widely used to form source/drain regions. By using the selective area epitaxial process to provide stress, the channel mobility of the transistor is improved and the performance of the transistor is enhanced.

However, the efficacy of using the conventional selective area epitaxial process to increase the performance of the transistor is still unsatisfied.

SUMMARY OF THE INVENTION

Therefore, the object of the present invention is to provide a process for manufacturing a stress-providing structure and a semiconductor device with such a stress-providing structure.

In accordance with an aspect, the present invention provides a process for manufacturing a stress-providing structure in fabrication of a semiconductor device. Firstly, a substrate with a channel structure is provided. Then, a silicon nitride layer is formed over the substrate by chemical vapor deposition in a halogen-containing environment. Then, an etching process is performed to partially remove the silicon nitride layer to expose a portion of a surface of the substrate beside the channel structure. Then, the exposed surface of the substrate is etched to form a recess in the substrate. After the recess is formed in the substrate, the substrate is thermally treated at a temperature between 750° C. and 820° C. After the substrate is thermally treated, a stress-providing material is filled in the recess to form a stress-providing structure within the recess.

In an embodiment, the process further includes a step of forming a gate structure over the channel structure.

In an embodiment, the halogen-containing environment is a chlorine-containing environment, and the chlorine-containing environment includes a chlorine-containing species.

In an embodiment, the chlorine-containing species is hexachlorodisilane ($Si_2Cl_6$) or dichlorosilane ($SiH_2Cl_2$).

In an embodiment, after the etching process is performed, the recess has a sigma-shaped inner surface.

In an embodiment, the step of thermally treating the substrate is performed by baking the substrate under a hydrogen gas atmosphere.

In an embodiment, after the step of thermally treating the substrate is performed, the recess has a round inner surface.

In an embodiment, after the substrate is thermally treated, the recess has a depth from 550 to 700 angstroms, and preferably from 600 to 650 angstroms.

In an embodiment, the substrate is a silicon substrate.

In an embodiment, the channel structure is a p-type channel structure, and the stress-providing material is silicon germanium (SiGe) or germanium.

In an embodiment, the channel structure is an n-type channel structure, and the stress-providing material is silicon carbide (SiC).

In accordance with another aspect, the present invention provides a semiconductor device. The semiconductor device includes a substrate, a recess and a stress-providing structure. A channel structure is formed in the substrate. The recess is formed in the substrate and arranged beside the channel structure. The recess has a round inner surface. The stress-providing structure is formed within the recess. Corresponding to the round inner surface, the stress-providing structure has a round outer surface.

In an embodiment, the semiconductor device further includes a gate structure, which is formed over the channel structure.

In an embodiment, the recess has a depth from 550 to 700 angstroms, and preferably from 600 to 650 angstroms.

In an embodiment, the substrate is a silicon substrate.

In an embodiment, the channel structure is a p-type channel structure, and the stress-providing structure is made of silicon germanium (SiGe) or germanium.

In an embodiment, the channel structure is an n-type channel structure, and the stress-providing structure is made of silicon carbide (SiC).

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1E schematically illustrate a process for fabricating a stress-providing structure according to an embodiment of the present invention. The process for fabricating the stress-providing structure may be applied to the fabrication of a semiconductor device such as a complementary metal-oxide-semiconductor (CMOS) transistor.

Figure 1A:
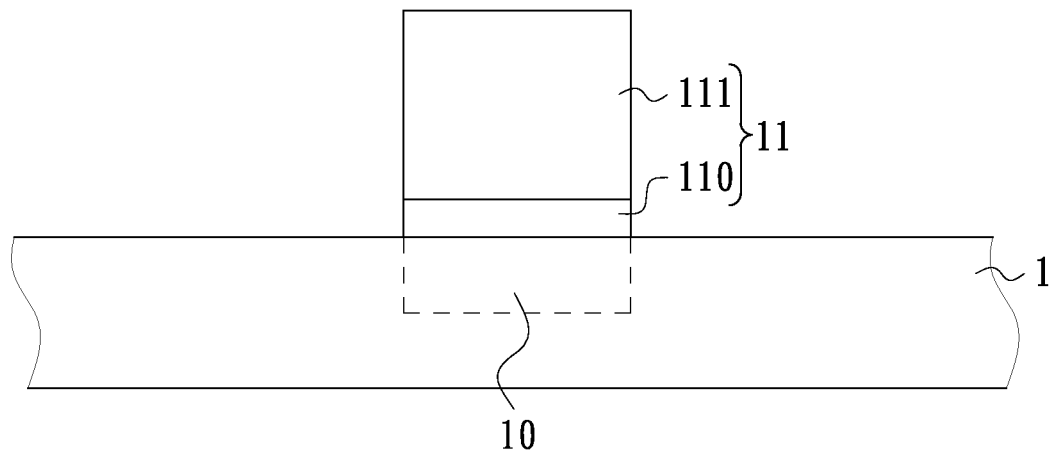
FIGS. 1A~1E schematically illustrate a process for fabricating a stress-providing structure according to an embodiment of the present invention.

Firstly, as shown in FIG. 1A, a substrate 1 is provided. An example of the substrate 1 includes but is not limited to a silicon substrate. In addition, a channel structure 10 is formed in the substrate 1, and a gate structure 11 is formed over the channel structure 10. In this embodiment, the gate structure 11 comprises a gate insulator layer 110 and a gate conductor layer 111.

Figure 1B:
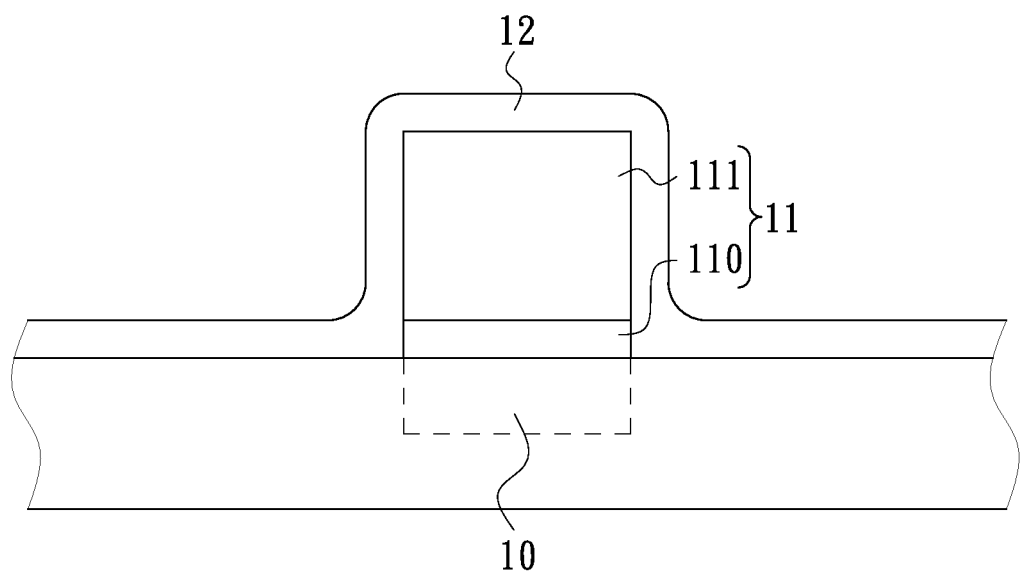

Then, as shown in FIG. 1B, a silicon nitride layer 12 is formed over the substrate 20 by chemical vapor deposition in a halogen-containing environment. In an embodiment, the chemical vapor deposition is performed in a chlorine-containing environment. The chlorine-containing environment includes a chlorine-containing species such as hexachlorodisilane ($Si_2Cl_6$, also referred as HCD) or dichlorosilane ($SiH_2Cl_2$, also referred as DCS). In such way, the silicon nitride layer 12 is chlorine-rich.

Figure 1C:
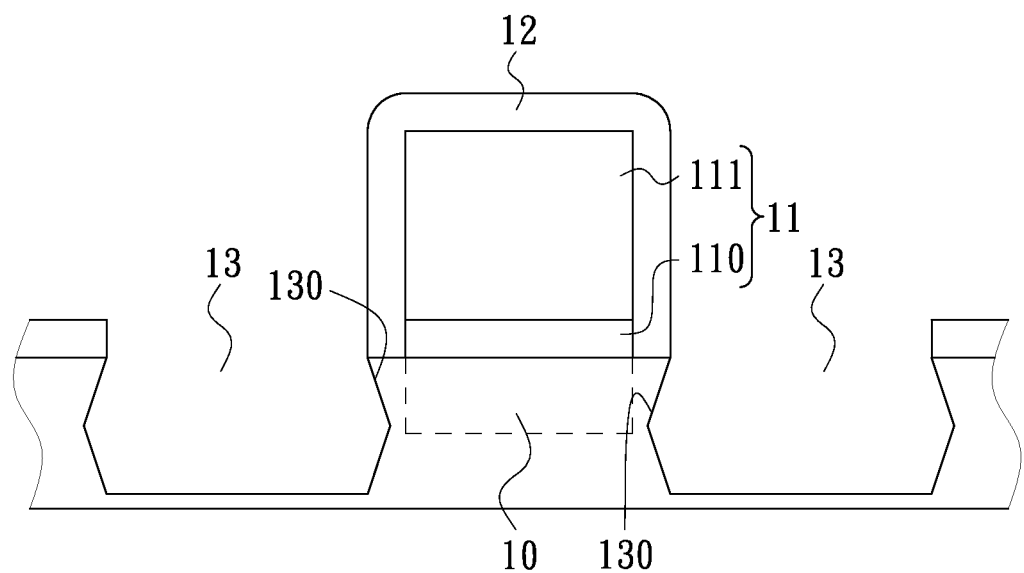
Figure 1D:
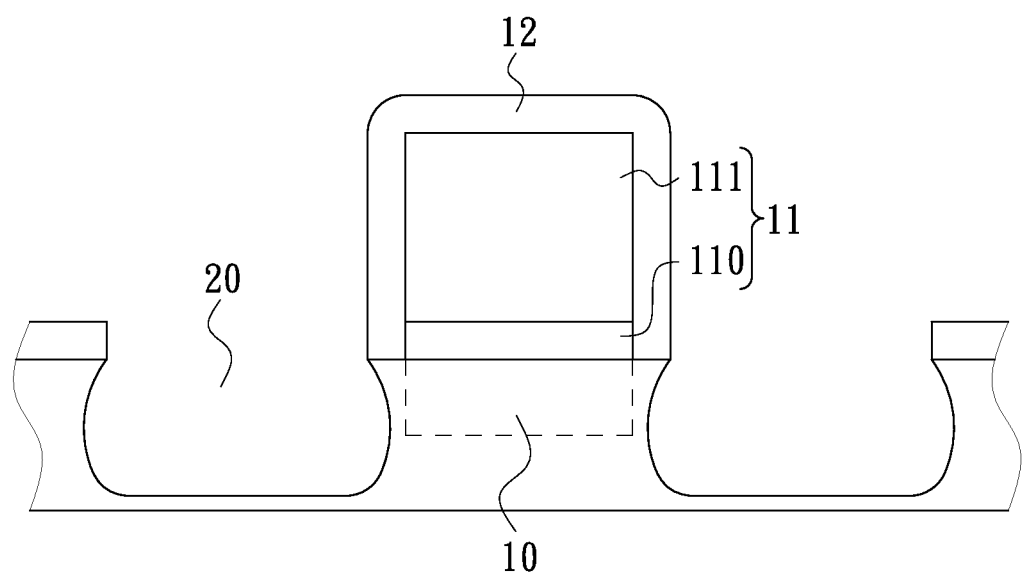
Figure 1E:
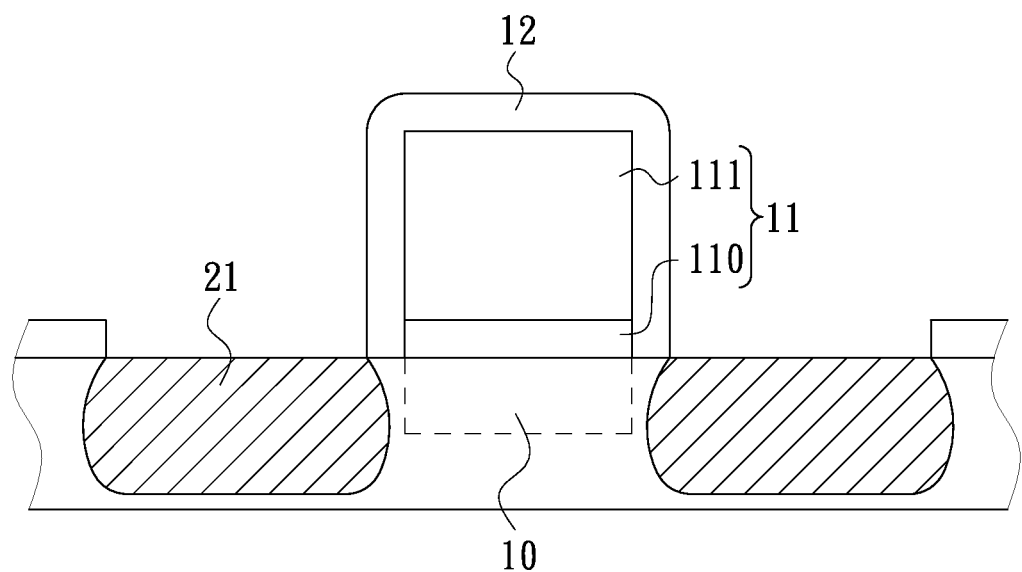

Then, as shown in FIG. 1C, a series of photolithography and etching processes are performed to partially remove the silicon nitride layer 12 so as to partially expose the surface of the substrate 1 beside the channel structure 10. Then, an etching process is performed to remove the exposed surface of the substrate 1 to produce a recess 13. The depth of the recess 13 is from 550 to 700 angstroms, and preferably from 600 to 650 angstroms. As shown in FIG. 1C, the recess 13 has a sigma-shaped inner surface 130. The profile of the sigma-shaped inner surface 130 is similar to the sidewall of the conventional embedded source/drain structure. By utilizing the lattice property of the silicon substrate and performing dry/wet etching processes, the sigma-shaped inner surface 130 will be produced.

Then, the substrate 1 with the recess 13 is subject to a thermal treatment process. For example, the thermal treatment process is performed by baking the substrate 1 under a hydrogen gas atmosphere at a temperature between 750° C. and 820° C. for a time period from 10 to 10000 seconds. Prior to the thermal treatment process, the halogen-rich atoms (e.g. chlorine-rich atoms) of the silicon nitride layer 12 are released to the inner surface of the recess 13, and the halogen-rich atoms and the silicon atoms interact with each other at the inner surface of the recess 13. Moreover, during the thermal treatment process is performed, the elevated temperature between 750° C. and 820° C. causes migration and recombination of the silicon atoms at the inner wall of the recess 13. Consequently, a recess 20 with a round inner surface 20 is produced (see FIG. 1D). The depth of the recess 20 is from 550 to 700 angstroms, and preferably from 600 to 650 angstroms.

Then, a stress-providing material is filled into the recess 20 to form a stress-providing structure 21 within the recess 20. Corresponding to the round inner surface of the recess 20, the stress-providing structure 21 has a round outer surface. In a case that the channel structure 10 is a p-type channel structure, the stress-providing material is silicon germanium (SiGe) or germanium (Ge). Whereas, in a case that the channel structure 10 is an n-type channel structure, the stress-providing material is silicon carbide (SiC).

From the above description, the process for manufacturing a stress-providing structure according to the present invention may be applied to the fabrication of a semiconductor device. The inner surface of the recess 20 has enhanced cleanliness and is chlorine-free. Moreover, the round inner surface of the recess is helpful for providing increased channel stress. Experiments demonstrate that if the stress-providing material is unchanged, the round inner surface of the recess may provide better channel mobility than the conventional sigma-shaped inner surface.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for manufacturing a stress-providing structure in fabrication of a semiconductor device, the process comprising steps of:
   providing a substrate with a channel structure;
   forming a silicon nitride layer over the substrate by chemical vapor deposition in a halogen-containing environment;
   performing an etching process to partially remove the silicon nitride layer to expose a portion of a surface of the substrate beside the channel structure;
   etching the exposed surface of the substrate to form a recess in the substrate;
   thermally treating the substrate at a temperature between 750° C. and 820° C. after the recess is formed in the substrate; and
   filling a stress-providing material in the recess to form a stress-providing structure within the recess after the substrate is thermally treated.

2. The process according to claim 1, further comprising a step of forming a gate structure over the channel structure.

3. The process according to claim 1, wherein the halogen-containing environment is a chlorine-containing environment, and the chlorine-containing environment comprises a chlorine-containing species.

4. The process according to claim 3, wherein the chlorine-containing species is hexachlorodisilane ($Si_2Cl_6$) or dichlorosilane ($SiH_2Cl_2$).

5. The process according to claim 1, wherein after the etching process is performed, the recess has a sigma-shaped inner surface.

6. The process according to claim 1, wherein the step of thermally treating the substrate is performed by baking the substrate under a hydrogen gas atmosphere.

7. The process according to claim 1, wherein after the step of thermally treating the substrate is performed, the recess has a round inner surface.

8. The process according to claim 1, wherein after the substrate is thermally treated, the recess has a depth from 600 to 650 angstroms.

9. The process according to claim 1, wherein the substrate is a silicon substrate.

10. The process according to claim 1, wherein the channel structure is a p-type channel structure, and the stress-providing material is silicon germanium (SiGe) or germanium.

11. The process according to claim 1, wherein the channel structure is an n-type channel structure, and the stress-providing material is silicon carbide (SiC).

* * * * *